United States Patent [19]
Fazan et al.

[11] Patent Number: 5,266,513
[45] Date of Patent: * Nov. 30, 1993

[54] METHOD OF MAKING STACKED W-CELL CAPACITOR

[75] Inventors: Pierre C. Fazan; Charles H. Dennison; Ruojia Lee; Yauh-Ching Liu, all of Boise, Id.

[73] Assignee: Micron Technology, Inc., Boise, Id.

[*] Notice: The portion of the term of this patent subsequent to Mar. 23, 2010 has been disclaimed.

[21] Appl. No.: 978,595

[22] Filed: Nov. 19, 1992

Related U.S. Application Data

[63] Continuation of Ser. No. 602,828, Oct. 24, 1990, Pat. No. 5,196,364.

[51] Int. Cl.⁵ .............................. H01L 21/70
[52] U.S. Cl. ........................ 437/52; 437/47; 437/48; 437/60; 437/919
[58] Field of Search ............ 437/47, 48, 52, 60, 437/228, 233, 235, 919

[56] References Cited
U.S. PATENT DOCUMENTS
4,977,102 12/1990 Ema ........................... 437/52
5,071,783 12/1991 Ema ........................... 437/52

FOREIGN PATENT DOCUMENTS
0072672 3/1990 Japan .
0079468 3/1990 Japan .
0135775 5/1990 Japan .

OTHER PUBLICATIONS
S. Inoue et al, "A Spread Stacked Capacitor (SSC) Cell for 64 mBit DRAMs" IEDM 89, pp. 31-34.
T. Ema et al., "3-Dimensional Stacked Capacitor Cell for 16 M DRAMs", IEDM 88, pp. 593-595.

*Primary Examiner*—Tom Thomas
*Attorney, Agent, or Firm*—David J. Paul

[57] ABSTRACT

A stacked multi fingered cell (SMFC) capacitor using a modified stacked capacitor storage cell fabrication process. The SMFC is made up of polysilicon structure, having a multi-fingered cross-section, located at a buried contact and extending to an adjacent storage node overlaid by polysilicon with a dielectric sandwiched in between. The addition of the polysilicon structure increases storage capability 120% without enlarging the surface area defined for a normal stacked capacitor cell.

9 Claims, 5 Drawing Sheets

This is a continuation to U.S. Pat. application Ser. No. 07/602,828 filed Oct. 24, 1990, now U.S. Pat. No. 5,196,364.

METHOD OF MAKING STACKED W-CELL CAPACITOR

CROSS-REFERENCE TO RELATED APPLICATION

This is a continuation to U.S. Pat. application Ser. No. 07/602,828 filed Oct. 24, 1990, now U.S. Pat. No. 5,196,364.

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, planarized layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3 - DIMENSIONAL STACKED CAPACITOR CELL FOR 16M AND 64M DRAMS," IEDM, Dig. Tech. Papers, pp. 592-595, 1988, herein incorporated by reference, discusses a 3 - dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64 MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked multi-fingered cell (SMFC) capacitor defined as a storage cell.

After a silicon wafer is prepared using conventional process steps, the present invention develops the SMFC by creating a multi fingered poly structure conforming to the topology formed by three adjacent word lines running perpendicular to two adjacent digit lines, which results in increased capacitor plate surface area for each storage cell. Such a structure has the potential to increase the capacitance of a conventional STC cell by 120%.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1-9.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
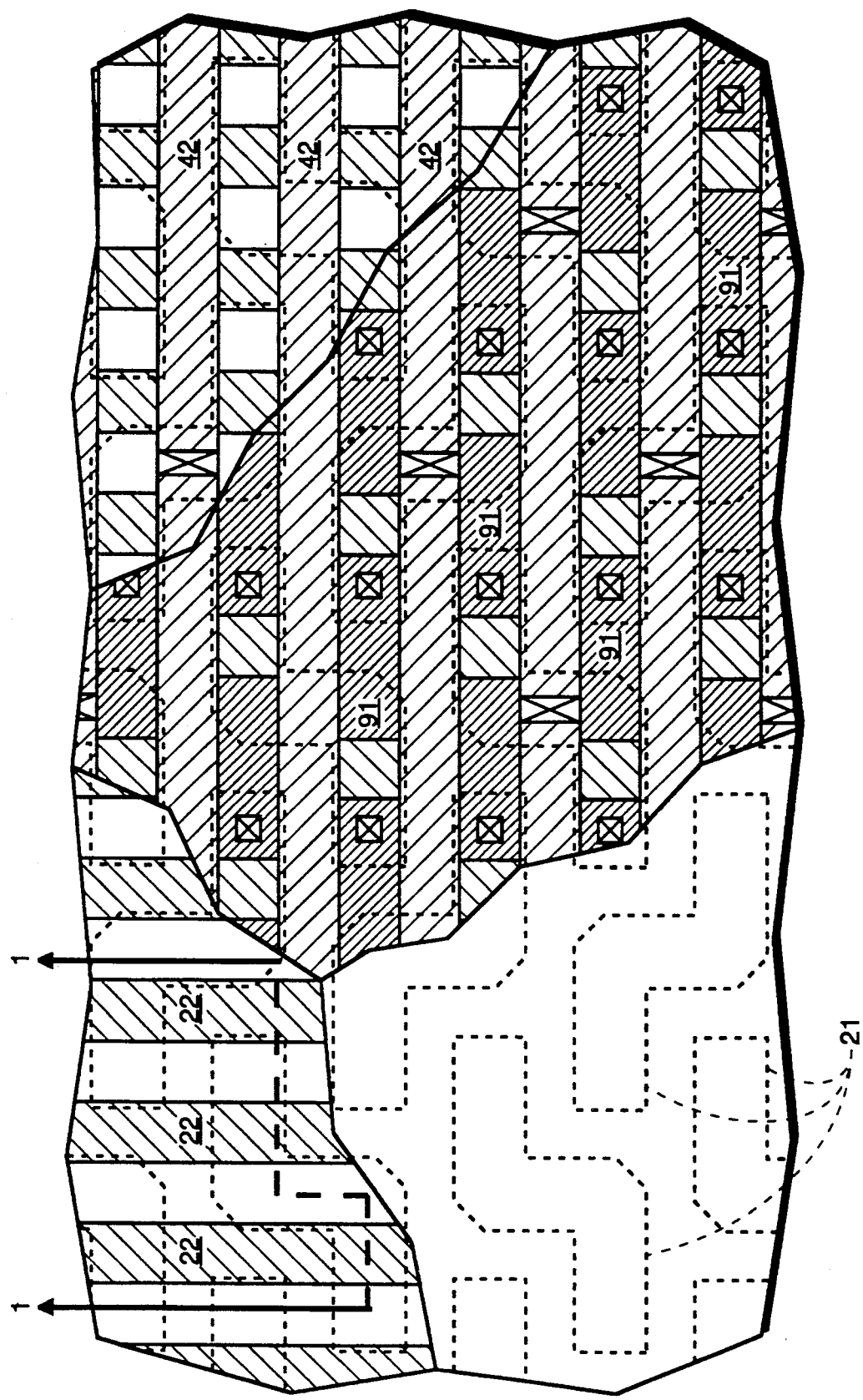
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 42, word lines 22, active area 21, and a storage node plate 91. Active areas 21 have been implanted in such a manner as to have each adjacent active area interweave with one another in the row direction (defined by parallel word lines 22) thereby forming parallel interdigitated rows of active areas 21. In the column direction (defined by parallel digit lines 42) each adjacent active area 21 run end to end thereby forming parallel non-interdigitated columns of active areas 21. The stacked capacitor structure of the preferred embodiment (the SMFC) is self-aligned to and over the top word lines 42 as well as to digit lines 22.

Figure 2:
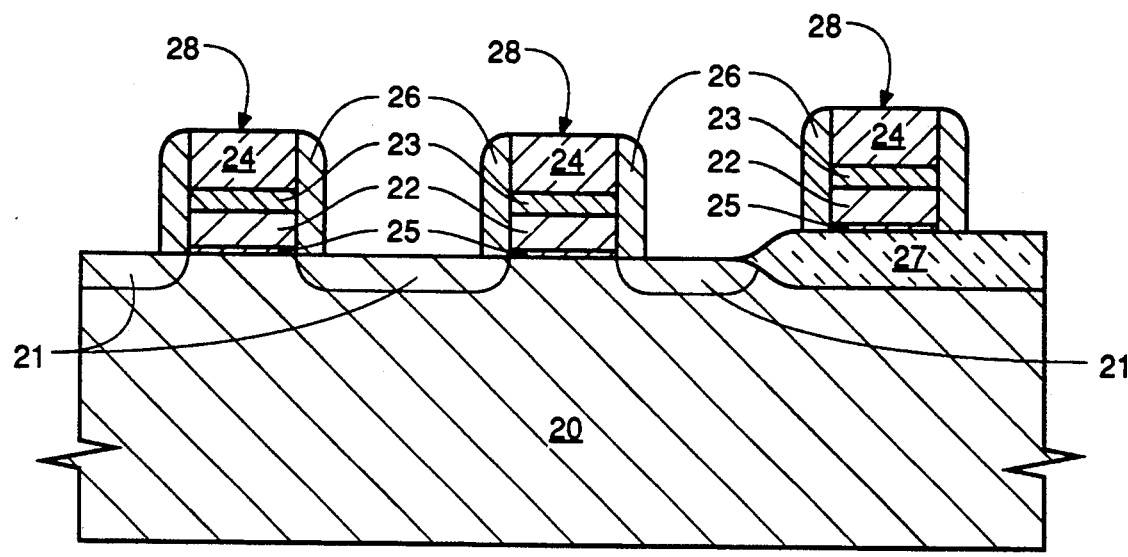
FIG. 2 is a cross-sectional view through broken line 1—1 of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation digit lines 42 will run perpendicular to and over the top of the word lines 22.

Figure 3:
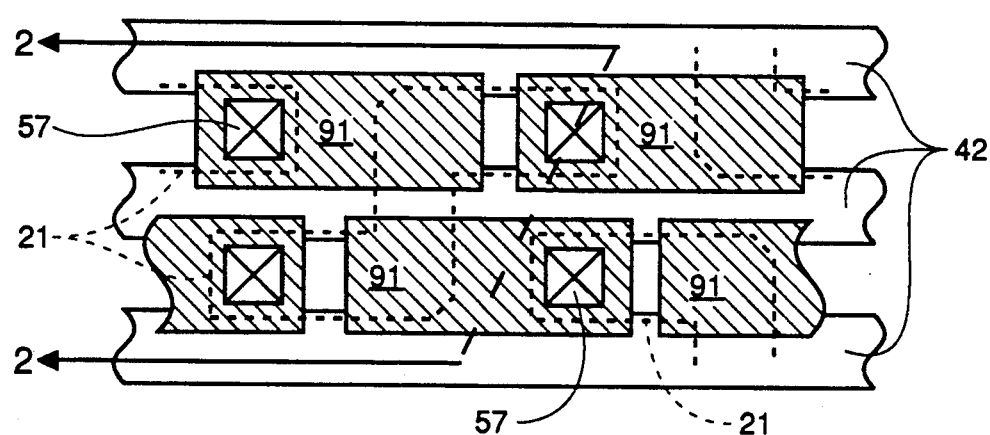
FIG. 3 is a top planar view of a portion of an in-process wafer showing digit lines, active areas, storage node contacts and storage capacitors.

FIG. 3 shows a top planar view of a portion of an in-process wafer showing digit lines 42, storage node contacts 57, active areas 21 and storage capacitors 91.

Figure 4:
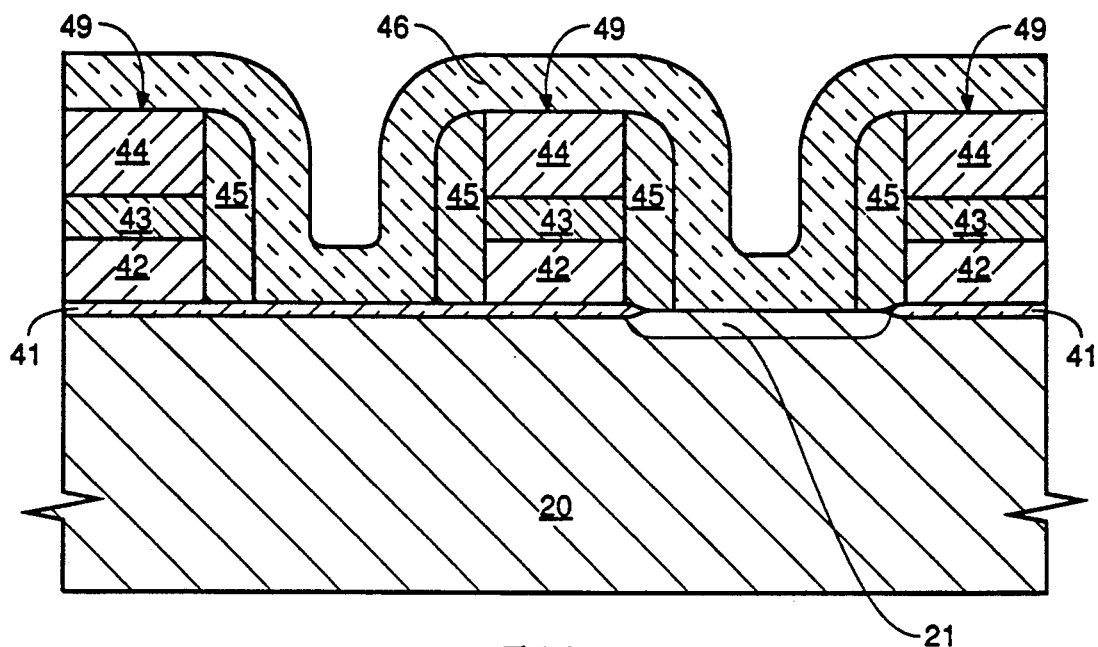
FIG. 4 is a cross-sectional view of the in-process wafer through broken line 2—2 of FIG. 3 following a blanket deposition of a conformal dielectric.

As shown in FIG. 4, an oxide layer 41 is deposited over the entire wafer array surface followed by a blanket deposition of polysilicon 42, silicide 43 and dielectric 44, respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to word lines 21 (shown in FIG. 2) and conform to the wafer surface resulting in a waveform-like topology running in both the digit line and word line directions.

Up to this point, process flow has followed that of an array comprising conventional stacked capacitor cells. From this point forward, the process is unique to an array having SMFC-type storage capacitors. A second dielectric 45, such as nitride or oxide is now deposited, followed by an anisotropic etch to form dielectric spacers 45. Digit lines 42 and their subsequent isolation layers are then covered with a dielectric 46 that is also either oxide or nitride, to a preferred thickness of 500 to 2000 angstroms by deposition.

In the preferred embodiment, when forming word line and digit line isolation, it is desirable to use one of the two following combinations of dielectrics. Referring to both FIGS. 2 and 4, combination one requires dielectrics 24 and 26 (FIG. 2), and dielectrics 44 and 45 to be oxides and dielectric 46 to be nitride. Combination two requires dielectrics 24 and 26 (FIG. 2), and dielectrics 44 and 45 (FIG. 4), to be nitride and dielectric 46 to be an oxide. The combination selected determines the etching step (discussed later in this description) used to construct the final poly capacitor structure desired. For example, combination one requires a nitride etching step, where combination two requires an oxide etching step.

Figure 5:
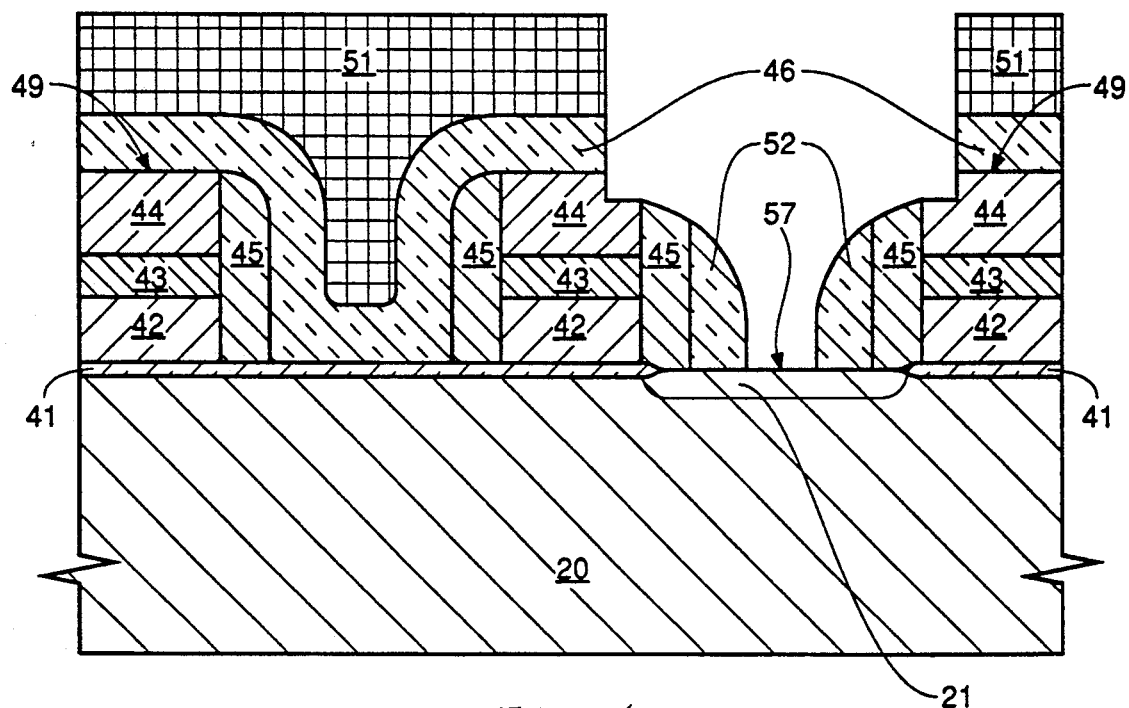
FIG. 5 is a cross-sectional view of the in-process wafer portion of FIG. 4 following a buried contact photo and etch.

As shown in FIG. 5, a buried contact 57, self-aligned to digit lines 42 by the presence of spacers 45, is located by covering all areas other than contact 57 with photoresist 51. After applying an appropriate photomask, a buried contact anisotropic etch on the exposed dielectric creates additional spacers 52 and provides an opening to locate contact 57.

Figure 6:
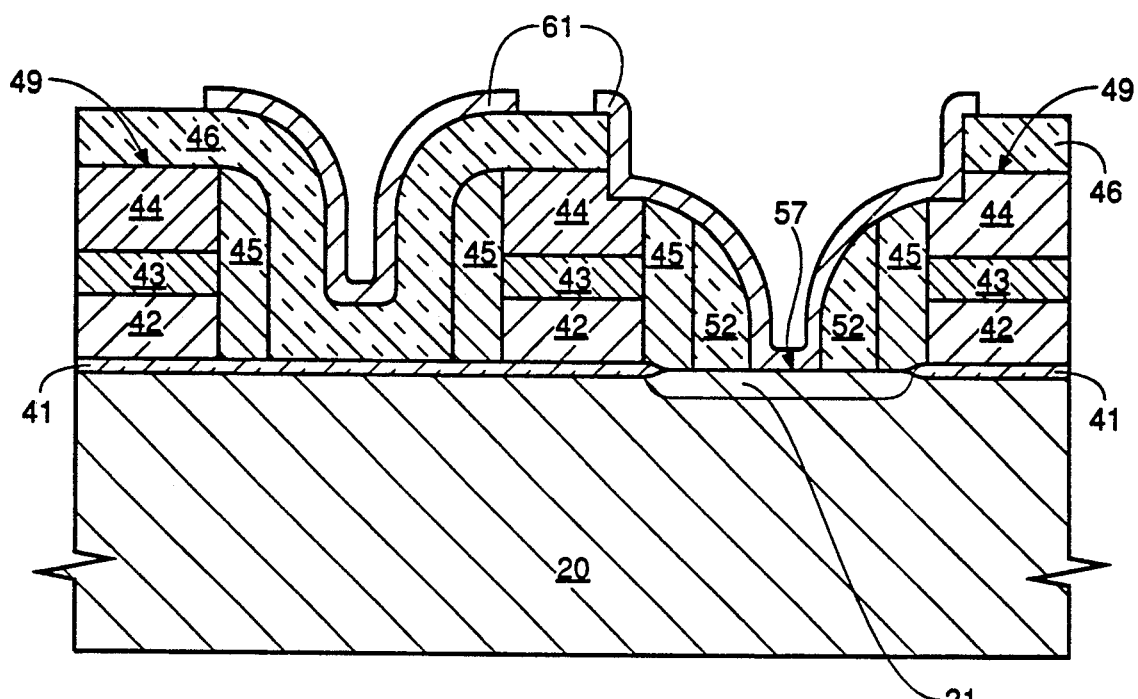
FIG. 6 is a cross-sectional view of the in-process wafer of portion of FIG. 5 following a photoresist strip, a blanket deposition of conformal poly followed by patterning of a poly storage node.

As shown in FIG. 6, the formation of a portion of a storage-node capacitor poly plate 61 results after the photoresist has been stripped followed by deposition of a conformal poly layer, preferably by low temperature deposition, over the entire array surface and couples to active area 21 via buried contact 57. The low temperature deposition causes the conformal poly layer to have a rugged textured surface that potentially doubles the surface area of poly layer 61. The conformal poly is conductively doped and patterned to serve as a portion of the storage node capacitor plate 61 mentioned previously. Plate 61 extends over an adjacent poly word line (the word line is not shown as it runs parallel to cross-sectional views of FIG. 6) and continues to the next adjacent word line. Plate 61 conforms to the two perpendicular waveform-like topology (created after digit line formation) which run in both the word lines and the digit lines directions.

Figure 7:
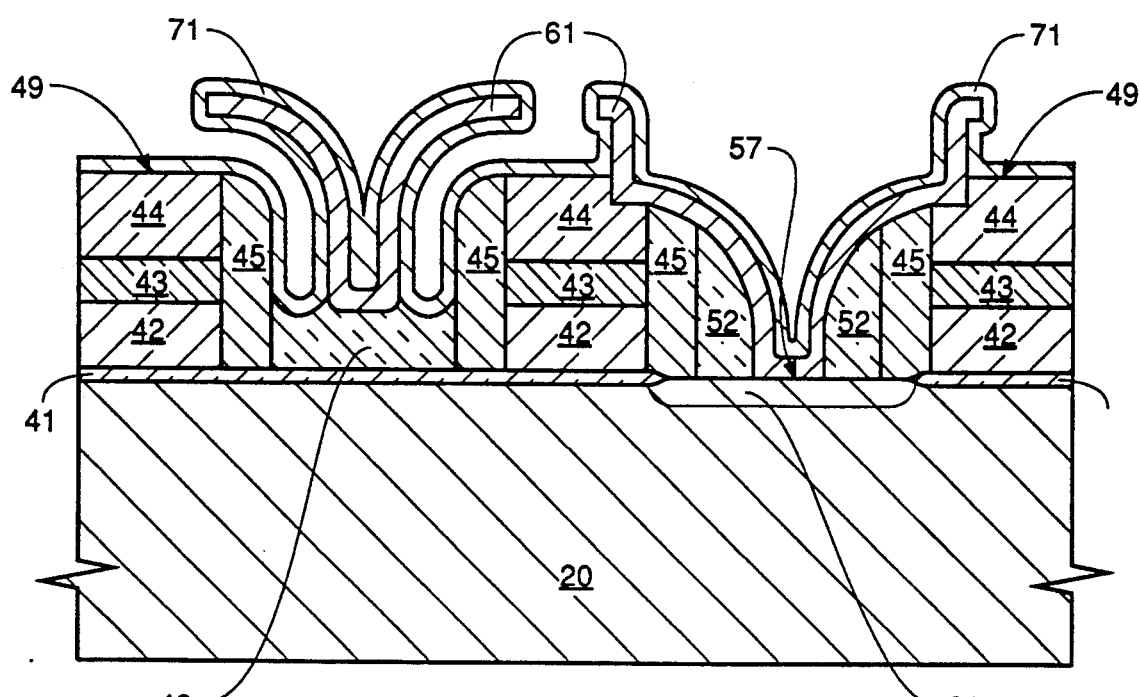
FIG. 7 is a cross-sectional view of the in-process wafer of portion of FIG. 6 following a controlled dielectric etch, a blanket deposition of conformal poly and doping of all poly layers.

As shown in FIG. 7, a controlled wet etch removes all but a portion of dielectric 46, in preparation for a deposition of conformal poly layer 71. If dielectric 46 is nitride a controlled nitride etch using phosphoric acid is performed and if dielectric 46 is oxide a controlled oxide etch using hydrofluoric acid is performed. Poly layer 71 conforms to both the inside and outside surfaces of plate 61 and all poly layers are doped either n-type or p-type depending on the conductivity type desired.

Figure 8:
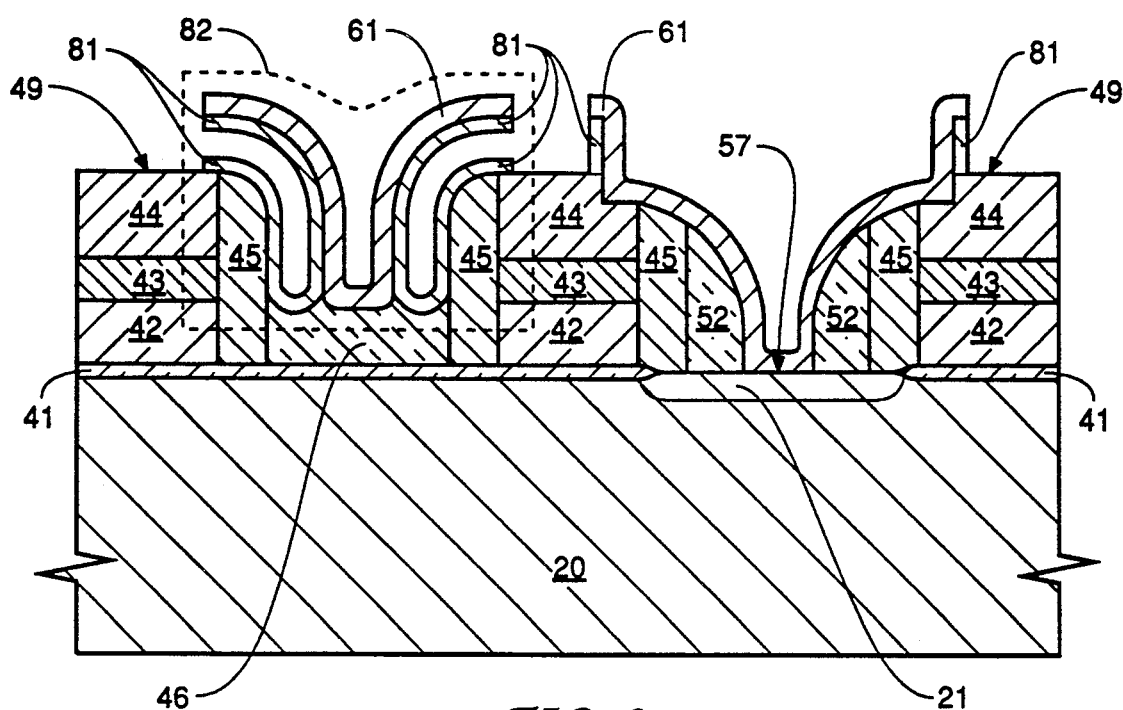
FIG. 8 is a cross-sectional view of the in-process wafer of portion of FIG. 7 following a complete dry etch of the preceding layer of conformal poly.
Figure 9:
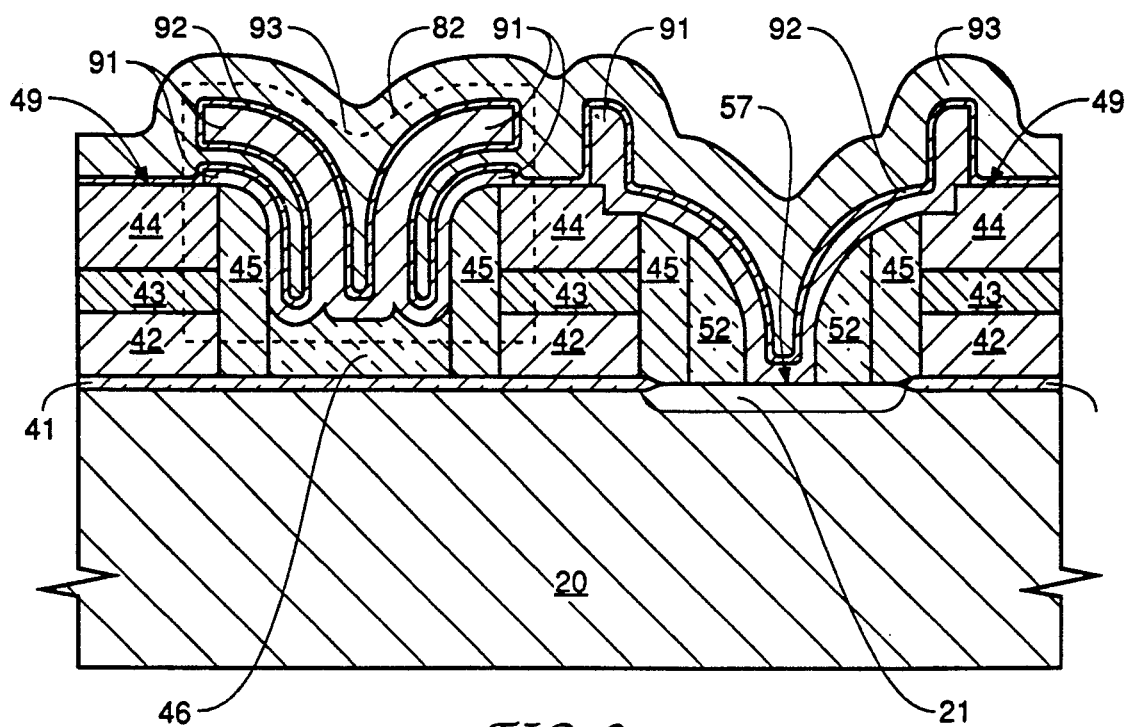
FIG. 9 is a cross-sectional view of the in-process wafer of portion of FIG. 6 following complete blanket depositions of conformal nitride and poly.

As shown in FIG. 8, a dry etch has been performed on poly layer 71 (FIG. 7) which causes poly 81 to remain only in areas that pattern directly to poly plate 61. Due to poly plate 61 and poly 81 being previously doped to the same conductivity type they bond together to form a completed multi fingered poly structure 91, as shown in FIG. 9, wherein the multi-fingered cross-section (enclosed by outline 82) resides outside the buried contact region but joins to its associated buried contact via plate 61. It is this multi-fingered poly structure 91, of FIG. 9, that will serve as a completed storage-node capacitor plate in the SMFC capacitor.

Also shown in FIG. 9, blanket depositions of conformal nitride 92 and poly 93 are performed. Poly 93 is conductively doped to serve as a top poly capacitor cell plate 93 of the SWC storage capacitor which also becomes a common cell plate to all SMFC storage capacitors in the array.

With the addition of poly plate 91 as the storage node plate along with top capacitor cell plate 93 that surrounds plate 91 substantial capacitor plate surface area is gained at the storage node. Since capacitance is mainly effected by the surface area of a capacitor's cell plates the additional area gained by a 3-dimensional SMFC structure can provide a 120% increase in capacitance over that of a conventional STC capacitor, without more space than that required for defining a stacked capacitor storage cell. The use of rugged poly for plate 91 can potentially doubles the overall capacitance increase.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM storage capacitor on a silicon substrate having active areas, word lines and digit lines, said process comprising the steps of:

forming a dielectric layer superjacent the surface of said silicon substrate;

creating an aligned buried contact location at a storage node junction in each said active area, wherein said aligned buried contact location is defined by a patterned photomask which exposes a portion of said first dielectric layer, said exposed dielectric layer being etched away to expose said storage node junction;

forming a first conductive layer superadjacent the patterned dielectric layer, said first conductive layer making contact to said storage node junction at said buried contact location;

patterning said first conductive layer to form a portion of a storage node plate at each said storage node junction, said storage node plate portion remaining in contact to said storage node junction at said buried contact location;

isotropically etching a remaining portion of said dielectric layer to thereby expose an underneath portion of said patterned first conductive layer, said underneath portion extending from said storage node junction to a gap between two adjacent word lines;

forming a second conductive layer superjacent said patterned first conductive layer and said exposed underneath first conductive layer portion, said second conductive layer combining with said first conductive layer;

patterning and dry etching said second conductive layer to form a complete storage node plate at said storage node junction, said storage node plate having a multi-fingered cross-section;

forming a cell dielectric layer adjacent and coextensive with said storage node plate and adjacent existing substrate surface; and forming a third conductive layer adjacent and coextensive said cell dielectric layer to form a top cell.

2. A process as recited in claim 1, wherein said dielectric layer is selected from the group consisting essentially of oxide and nitride.

3. A process as recited in claim 1, wherein said etching of said dielectric is a controlled phosphoric acid wet etch.

4. A process as recited in claim 1, wherein said etching of said dielectric is a controlled hydrofluoric acid wet etch.

5. A process as recited in claim 1, wherein said buried contact is self aligned.

6. A process as recited in claim 1, wherein said first and second conductive layers are doped polysilicon.

7. A process as recited in claim 6, wherein said first and second conductive layers are deposited by low temperature deposition.

8. A process as recited in claim 1, wherein said dielectric layer is deposited by chemical vapor deposition.

9. A process as recited in claim 1, wherein said cell dielectric layer is nitride.

* * * * *